United States Patent
Buchert et al.

(10) Patent No.: US 11,882,650 B2
(45) Date of Patent: Jan. 23, 2024

(54) DEVICE FOR POWER TRANSMISSION, POWER CONVERTER, AND AIRCRAFT

(71) Applicant: Rolls-Royce Deutschland Ltd & Co KG, Blankenfelde-Mahlow (DE)

(72) Inventors: Stanley Buchert, Herzogenaurach (DE); Uwe Waltrich, Erlangen (DE); Antonio Zangaro, Schwanstetten (DE)

(73) Assignee: ROLLS-ROYCE DEUTSCHLAND LTD & CO KG, Blankenfelde-Mahlow (DE)

(*) Notice: Subject to any disclaimer, the term of this patent is extended or adjusted under 35 U.S.C. 154(b) by 509 days.

(21) Appl. No.: 17/251,190

(22) PCT Filed: May 23, 2019

(86) PCT No.: PCT/EP2019/063351
§ 371 (c)(1),
(2) Date: Dec. 10, 2020

(87) PCT Pub. No.: WO2019/238381
PCT Pub. Date: Dec. 19, 2019

(65) Prior Publication Data
US 2023/0132321 A1 Apr. 27, 2023

(30) Foreign Application Priority Data
Jun. 11, 2018 (DE) .............. 10 2018 209 247.8

(51) Int. Cl.
*H05K 1/02* (2006.01)
*B64D 27/24* (2006.01)
*B64D 35/00* (2006.01)

(52) U.S. Cl.
CPC ........... *H05K 1/0271* (2013.01); *B64D 27/24* (2013.01); *B64D 35/00* (2013.01); *H05K 1/0213* (2013.01);
(Continued)

(58) Field of Classification Search
CPC ...... H05K 1/02; H05K 1/0213; H05K 1/0271; H05K 1/14; H05K 1/141–147;
(Continued)

(56) References Cited

U.S. PATENT DOCUMENTS 6,659,779 B1 * 12/2003 Harris ............... G06F 1/189
361/784
7,127,142 B2 * 10/2006 Miyamae ............ G02B 6/4201
385/88

(Continued)

OTHER PUBLICATIONS

International Search Report and the Written Opinion for International Patent Application PCT/EP2019/063351 dated Sep. 17, 2019.

*Primary Examiner* — Tuan T Dinh
(74) *Attorney, Agent, or Firm* — Lempia Summerfield Katz LLC

(57) ABSTRACT

A device includes a circuit carrier board and a conductor element that is configured to transfer an electric current from and/or to the circuit carrier board. The device includes an electrically conductive, elastically deformable, contoured, plate-like connection element that connects the circuit carrier board to the conductor element and is configured to create a local, dynamic resilience. As a result of this, a force transmission front the conductor element to the circuit carrier board may be reduced. A plate thickness of the connection element is at least 2 cm. A power converter and an aircraft having such a device are also provided.

15 Claims, 2 Drawing Sheets

(52) U.S. Cl.
CPC .............. *H05K 2201/068* (2013.01); *H05K 2201/10272* (2013.01)

(58) Field of Classification Search
CPC ... H05K 2201/068; H05K 2201/10272; H05K 7/14329; H05K 7/14; H05K 5/00; H05K 5/04; H05K 5/06; B64D 27/24; B64D 35/00
USPC ........ 361/749, 775–778, 816, 818; 174/254; 439/76.2
See application file for complete search history.

(56) References Cited

U.S. PATENT DOCUMENTS

| | | | | |
|---|---|---|---|---|
| 7,260,285 | B2* | 8/2007 | Mitamura | H05K 1/147 385/88 |
| 9,535,213 | B2* | 1/2017 | Sugiyama | G02B 6/12 |
| 2004/0053040 | A1* | 3/2004 | Goodson | B32B 37/185 428/326 |
| 2004/0074596 | A1* | 4/2004 | Stambridge | B42C 3/00 156/260 |
| 2004/0156179 | A1 | 8/2004 | Hockett | |
| 2004/0264882 | A1* | 12/2004 | Torigoe | H05K 1/0224 385/88 |
| 2005/0078467 | A1* | 4/2005 | Barr | H05K 3/222 361/818 |
| 2011/0205703 | A1* | 8/2011 | Weaver | G03B 37/02 248/299.1 |
| 2015/0009549 | A1* | 1/2015 | Khechana | B81C 3/005 359/199.3 |

\* cited by examiner

DEVICE FOR POWER TRANSMISSION, POWER CONVERTER, AND AIRCRAFT

This application is the National Stage of International Application No. PCT/EP2019/063351, filed Mar. 23, 2019, which claims the benefit of German Patent Application No. 10 2018 209 247.8, filed Jun. 11, 2018. The entire contents of these documents are hereby incorporated herein by reference.

FIELD

The present embodiments relate to power transmission.

BACKGROUND

For example, power-electronics assemblies are often contact-connected to one another via solid busbars. Owing to thermal expansion under temperature and vibration, high forces act on the connecting points of the busbars to the assemblies. These forces may lead to failure of the assemblies.

It is known to use flexible busbars (e.g., conductor element) or overdimensioning of the connecting points.

A power converter that uses an AC voltage or DC voltage to produce an AC voltage, the frequency and amplitude of which are varied, is referred to as an inverter. Inverters are often configured as AC/DC-DC/AC inverters or DC/AC inverters, where an AC output voltage is generated from an AC input voltage or a DC input voltage via a DC link and clocked semiconductors.

An aircraft may be any type of airborne way of locomotion or transportation, whether manned or unmanned.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a further solution with which the fail-safety of electrical and/or electronic assemblies under thermal loading is improved is provided.

According to the present embodiments, a local elastic and dynamic resilience is created (e.g., elastic spring action) by a suitable structural design of the connecting element that connects the circuit carrier board to the conductor element. As a result, the forces due to thermal expansion and due to dynamic deflection of the conductor elements are absorbed with a low level of stress.

The present embodiments provide the advantages of reducing the number of parts, saving weight, exhibiting less transfer resistance in comparison to spring/plug-in contacts, and reducing the installation space in comparison to known screw contacts (e.g., cable shoe contacts).

The present embodiments include a device including a circuit carrier board and a conductor element that may transmit an electric current from and/or to the circuit carrier board. The device also has an electrically conductive, elastically deformable, contoured, plate-like connecting element that connects the circuit carrier board to the conductor element and is configured to create a local dynamic resilience. As a result of this, force transmission from the conductor element to the circuit carrier board may be reduced, and a plate thickness of the connecting element is at least 2 cm.

In a development, the device may have a first connecting area of the connecting element that is in contact with the conductor element, and a second connecting area of the connecting element that is in contact with the circuit carrier board. The first connecting area is perpendicular to the second connecting area.

In a further embodiment, the connecting element may be configured to deflect the electric current through 90 degrees.

In a development, the device may have a first connector that is configured to electrically and mechanically connect the connecting element to the conductor element, and a second connector that is configured to electrically and mechanically connect the connecting element to the circuit carrier board.

In a further refinement, the connecting element may be configured as a metal plate that has a slot that tapers in the direction of the edge of the metal plate and is open at the edge.

In a further embodiment, the connecting element may be formed from a rod-like metal body that is bent like a ring.

In a further form, the connecting element may be configured as a structure that meanders in longitudinal section.

In a further refinement, the connecting element may be manufactured from a metal sheet by bending, cutting, or milling.

In a further refinement, the connecting element may be manufactured by milling, 3D printing, casting, or extrusion.

In a development, the first connector and/or the second connector may have a screw connection, a weld connection, a solder connection, an adhesive bond, a clamping connection, or a pressing connection.

The present embodiments also include a power converter including a device according to the present embodiments, where the power converter may be an inverter in one development.

The present embodiments also include an aircraft including a power converter according to the present embodiments for an electric or hybrid-electric aircraft propulsion system, where the aircraft may be, for example, an airplane.

In one development, the aircraft may have an electric motor that is supplied with electrical energy by the inverter, and a propeller that may be set in rotation by the electric motor.

DETAILED DESCRIPTION

Figure 1:
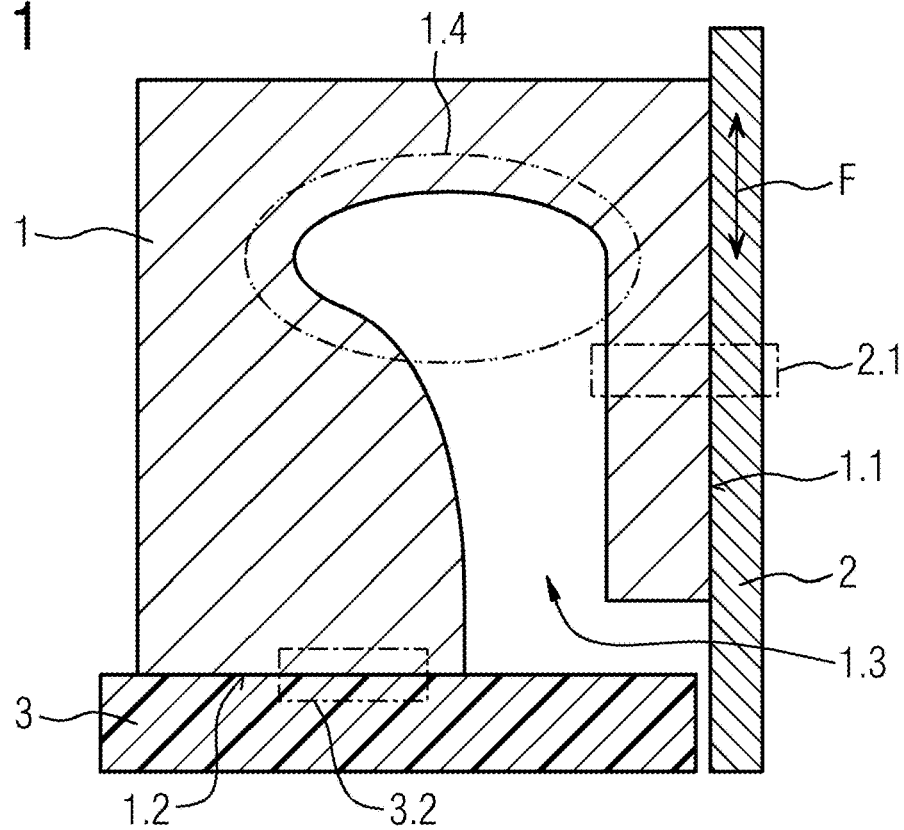
FIG. 1 shows a sectional view of one embodiment of a device including a flow-optimized connecting element.

FIG. 1 shows one embodiment of a device including a circuit carrier board 3 (e.g., a printed circuit board), on which power semiconductors (not illustrated) are arranged, for example, and including a conductor element 2 via which the electric current that is required for the circuit carrier board 3 may be supplied. The connecting element 1, which transmits the electric current and electrically connects the conductor element 2 to the circuit carrier board 3, serves for this purpose.

The connecting element 1, by way of a first connecting area 1.1, is electrically conductively contact-connected to the conductor element 2 with the aid of a first connector 2.1. The connecting element 1, by way of a second connecting area 1.2, is also electrically conductively contact-connected to the circuit carrier board 3 with the aid of a second connector 3.2. The first connector 2.1 and the second connector 3.2 may have a screw connection, a weld connection, a solder connection, an adhesive bond, a clamping connection, or a pressing connection for safe electrical contact-connection and mechanical connection.

The connecting element is of plate-like design (e.g., composed of copper) and has a slotted inner contour 1.4 that is stress-optimized (e.g., has a sufficient resilience (spring action)) in order to largely decouple a movement of the conductor element 2 (force F) from the circuit carrier board 3. As a result, only small forces are applied to the second connector 3.2 from a movement of the conductor element. Therefore, thermal expansion and mechanical vibration of the conductor element 2 may not cause any damage.

The slot 1.3 with the contour 1.4 exhibits, in a longitudinal section of the connecting element 1, a boot-like shape, where the bootleg passes through that edge of the connecting element 1 that points toward the circuit carrier board 3. In order to be able to take up a sufficient current intensity, the thickness of the connecting element 1 is at least 2 cm perpendicular to the plane of the drawing.

The connecting element may be manufactured from a metal sheet by cutting or milling. As an alternative, production options include 3D printing, casting, or extrusion.

Figure 2:
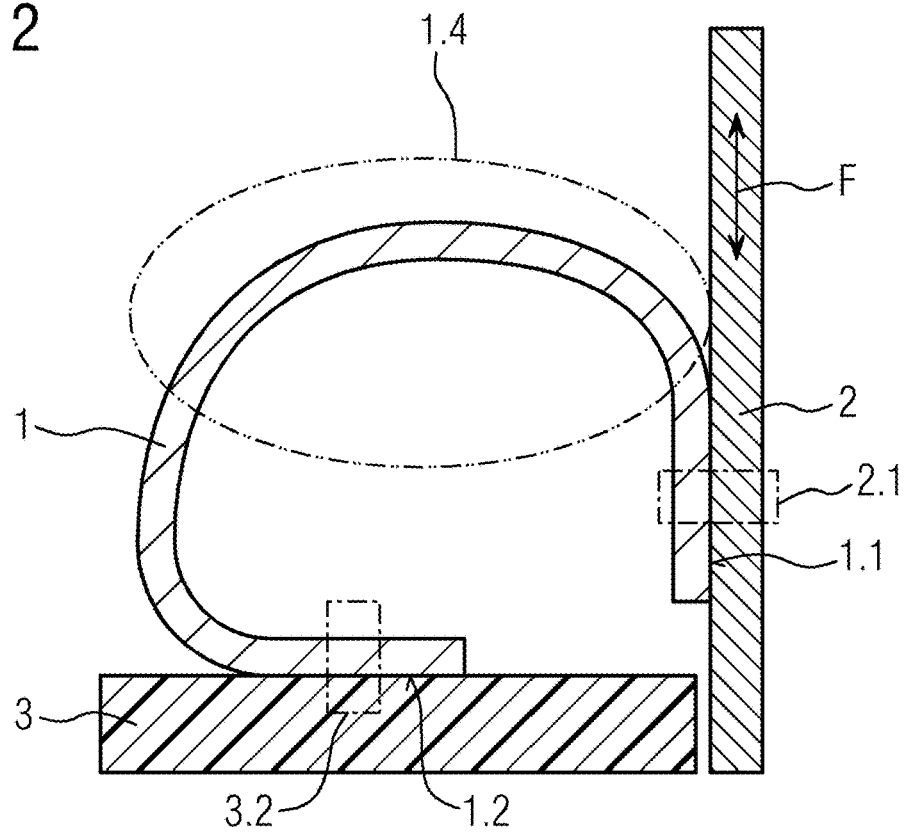
FIG. 2 shows a sectional view of one embodiment of a device including a weight-optimized connecting element.

FIG. 2 shows a device including a circuit carrier board 3 (e.g., a printed circuit board), on which power semiconductors (not illustrated) are arranged, for example, and including a conductor element 2 via which the electric current that is required for the circuit carrier board 3 may be supplied. The connecting element 1 that transmits the electric current and electrically connects the conductor element 2 to the circuit carrier board 3 serves for this purpose.

The connecting element 1, by way of a first connecting area 1.1, is electrically conductively contact-connected to the conductor element 2 with the aid of a first connector 2.1. The connecting element 1, by way of a second connecting area 1.2, is also electrically conductively contact-connected to the circuit carrier board 3 with the aid of a second connector 3.2. The first connector 2.1 and the second connector 3.2 may have a screw connection, a weld connection, a solder connection, an adhesive bond, a clamping connection, or a pressing connection for safe electrical contact-connection and mechanical connection.

The connecting element 1 is of plate-like design (e.g., composed of copper) and has contour 1.4 that is elongate and bent in side view, and is stress-optimized (e.g., has a sufficient resilience (spring action) in order to largely decouple a movement of the conductor element 2 (force F) from the circuit carrier board 3). As a result, only small forces are applied to the second connector 3.2 from a movement of the conductor element. Therefore, thermal expansion and mechanical vibration of the conductor element 2 may not cause any damage.

The contour 1.4 and the longitudinal section of the connecting element 1 exhibit an oval shape that is severed between the first connecting area 2.1 and the second connecting area 3.2 and has a gap. In order to be able to take up a sufficient current intensity, the thickness of the connecting element 1 is at least 2 cm thick perpendicular to the plane of the drawing.

The connecting element may be manufactured from a metal sheet by cutting, bending, or milling. As an alternative, production options include 3D printing, casting, or extrusion.

Figure 3:
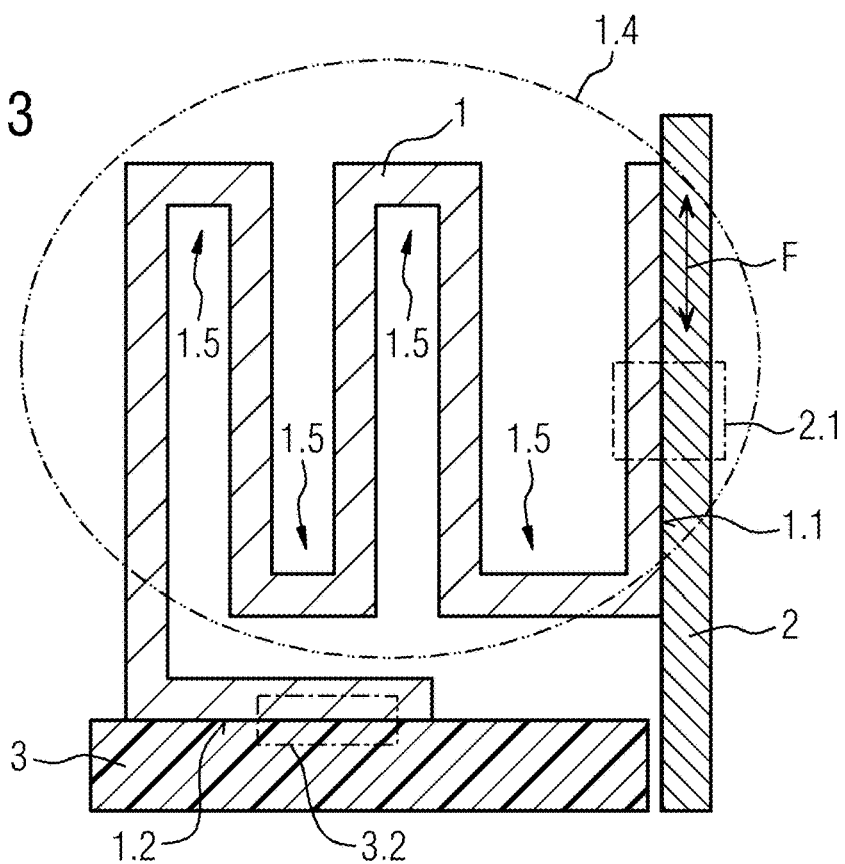
FIG. 3 shows a sectional view of one embodiment of a device including a weight-optimized connecting element that is configured with a maximum two-dimensional resilience.

FIG. 3 shows one embodiment of a device including a circuit carrier board 3 (e.g., a printed circuit board), on which power semiconductors (not illustrated) are arranged, for example, and including a conductor element 2 via which the electric current that is required for the circuit carrier board 3 may be supplied. The connecting element 1, which transmits the electric current and electrically connects the conductor element 2 to the circuit carrier board 3, serves for this purpose.

The connecting element 1, by way of a first connecting area 1.1, is electrically conductively contact-connected to the conductor element 2 with the aid of a first connector 2.1. The connecting element 1, by way of a second connecting area 1.2, is also electrically conductively contact-connected to the circuit carrier board 3 with the aid of a second connector 3.2. The first connector 2.1 and the second connector 3.2 may have a screw connection, a weld connection, a solder connection, an adhesive bond, a clamping connection, or a pressing connection for safe electrical contact-connection and mechanical connection.

The connecting element is of plate-like design (e.g., composed of copper) and has a meandering contour 1.4 and structure in side view that is stress-optimized (e.g., has a sufficient resilience (spring action) in order to largely decouple a movement of the conductor element 2 (force F) from the circuit carrier board 3). As a result, only small forces are applied to the second connector 3.2 from a movement of the conductor element. Therefore, thermal expansion and mechanical vibration of the conductor element 2 may not cause any damage.

The contour 1.4 and the longitudinal section of the connecting element 1 exhibit an angularly meandering shape 1.5 that has a gap between the first connecting area 1.1 and the second connecting area 1.2. The selected contour 1.4 and angular meander 1.5 provide a "concertina effect". In order to be able to take up a sufficient current intensity, the thickness of the connecting element 1 is at least 2 cm thick perpendicular to the plane of the drawing.

The connecting element may be manufactured from a metal sheet by cutting, bending, or milling. As an alternative, production options include 3D printing, casting, or extrusion.

Figure 4:
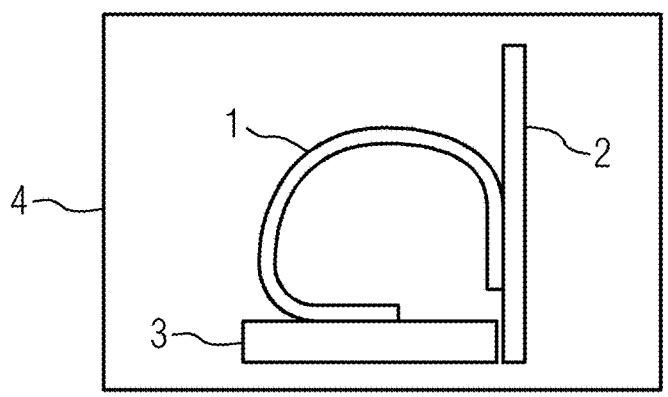
FIG. 4 shows a block diagram of one embodiment of an inverter including the device including a connecting element.

FIG. 4 shows a block diagram of one embodiment of an inverter 4 including a device including a connecting element 1 according to FIG. 1 to FIG. 3. The inverter 4 has a circuit carrier board 3 that is electrically connected to the conductor element 2 with the aid of the connecting elements 1. In one embodiment the inverter 4 is a power converter.

Figure 5:
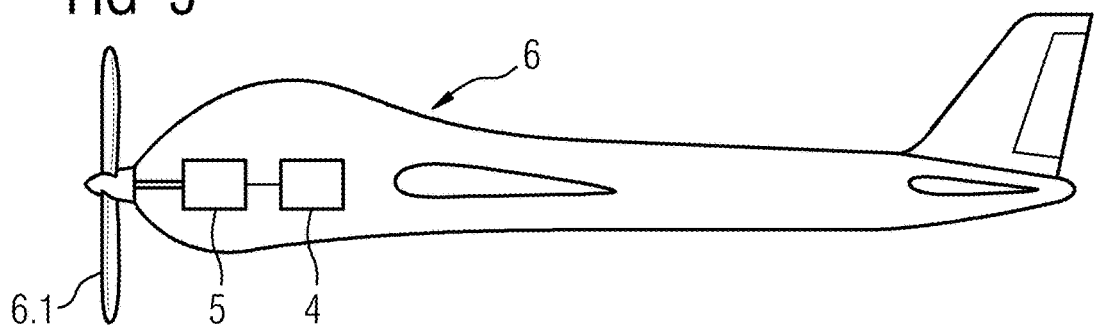
FIG. 5 shows one embodiment of an aircraft including an electric aircraft propulsion system.

FIG. 5 shows one embodiment of an electric or hybrid-electric aircraft 6 (e.g., an airplane) including an inverter 4 according to FIG. 4 that supplies an electric motor 5 with electrical energy. The electric motor 5 drives a propeller 6.1.

Although the invention has been described and illustrated more specifically in detail by the exemplary embodiments, the invention is not restricted by the disclosed examples, and other variations may be derived therefrom by a person skilled in the art without departing from the scope of protection of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A device comprising:
a circuit carrier board;
a conductor element configured to transmit an electric current from, to, or from and to the circuit carrier board;
a connecting element that is electrically conductive, elastically deformable, contoured, and plate-like, the connecting element connecting the circuit carrier board to the conductor element and being configured to create a local dynamic resilience, as a result of which a force transmission from the conductor element to the circuit carrier board is reducible;
a first connecting area of the connecting element that is in contact with and electrically connected to the conductor element; and
a second connecting area of the connecting element that is in contact with and electrically connected to the circuit carrier board,
wherein the first connecting area is perpendicular to the second connecting area, and
wherein a plate thickness of the connecting element is at least 2 cm.

2. The device of claim 1, wherein the connecting element is configured to deflect the electric current through 90 degrees.

3. The device of claim 1, further comprising:
a first connector configured to electrically and mechanically connect the connecting element to the conductor element; and
a second connector configured to electrically and mechanically connect the connecting element to the circuit carrier board.

4. The device of claim 1, wherein the connecting element is configured as a metal plate that has a slot that tapers in a direction of an edge of the metal plate and is open at the edge.

5. The device of claim 1, wherein the connecting element is formed from a rod-like metal body that is bent like a ring.

6. The device of claim 1, wherein the connecting element is configured as a structure that meanders in a longitudinal section.

7. The device of claim 1, wherein the connecting element is manufactured from a metal sheet by bending, cutting, or milling.

8. The device of claim 1, wherein the connecting element is milled, 3D printed, cast, or extruded.

9. The device of claim 3, wherein the first connector, the second connector, or the first connector and the second connector have a screw connection, a weld connection, a solder connection, an adhesive bond, a clamping connection, or a pressing connection.

10. A power converter comprising:
a device comprising:
a circuit carrier board;
a conductor element configured to transmit an electric current from, to, or from and to the circuit carrier board;
a connecting element that is electrically conductive, elastically deformable, contoured, and plate-like, the connecting element connecting the circuit carrier board to the conductor element and being configured to create a local dynamic resilience, as a result of which a force transmission from the conductor element to the circuit carrier board is reducible;
a first connecting area of the connecting element that is in contact with and electrically connected to the conductor element; and
a second connecting area of the connecting element that is in contact with and electrically connected to the circuit carrier board,
wherein the first connecting area is perpendicular to the second connecting area, and
wherein a plate thickness of the connecting element is at least 2 cm.

11. The power converter of claim 10, wherein the power converter is an inverter.

12. An aircraft comprising:
a power converter for an electric or hybrid-electric aircraft propulsion system, the power converter comprising:
a device comprising:
a circuit carrier board;
a conductor element configured to transmit an electric current from, to, or from and to the circuit carrier board;
a connecting element that is electrically conductive, elastically deformable, contoured, and plate-like, the connecting element connecting the circuit carrier board to the conductor element and being configured to create a local dynamic resilience, as a result of which a force transmission from the conductor element to the circuit carrier board is reducible;
a first connecting area of the connecting element that is in contact with and electrically connected to the conductor element; and
a second connecting area of the connecting element that is in contact with and electrically connected to the circuit carrier board,
wherein the first connecting area is perpendicular to the second connecting area, and
wherein a plate thickness of the connecting element is at least 2 cm.

13. The aircraft of claim 12, wherein the aircraft is an airplane.

14. The aircraft of claim 12, further comprising:
an electric motor that is supplied with electrical energy by the inverter; and
a propeller that is settable in rotation by the electric motor.

15. A device comprising:
a circuit carrier board;
a conductor element configured to transmit an electric current from, to, or from and to the circuit carrier board; and
a connecting element that is electrically conductive, elastically deformable, contoured, and plate-like, the connecting element connecting the circuit carrier board to the conductor element and being configured to create a local dynamic resilience, as a result of which a force transmission from the conductor element to the circuit carrier board is reducible, wherein a plate thickness of the connecting element is at least 2 cm, and wherein the connecting element is configured as a metal plate that has a slot that tapers in a direction of an edge of the metal plate and is open at the edge.

* * * * *